United States Patent
Brewton

(10) Patent No.: US 7,246,056 B1
(45) Date of Patent: Jul. 17, 2007

(54) RUNTIME PARAMETER MAPPING FOR SYSTEM SIMULATION

(75) Inventor: Nathan E. Brewton, Medford, MA (US)

(73) Assignee: The Mathworks, Inc., Natick, MA (US)

( * ) Notice: Subject to any disclaimer, the term of this patent is extended or adjusted under 35 U.S.C. 154(b) by 635 days.

(21) Appl. No.: 10/672,686

(22) Filed: Sep. 26, 2003

(51) Int. Cl.
*G06F 17/50* (2006.01)
*G06F 3/00* (2006.01)

(52) U.S. Cl. .......................... 703/20; 703/21; 717/127; 716/5

(58) Field of Classification Search .................. 703/13, 703/22, 23, 24, 20, 21; 712/13, 15; 717/127; 716/5
See application file for complete search history.

(56) References Cited

U.S. PATENT DOCUMENTS

| | | | | |
|---|---|---|---|---|
| 5,475,842 A | * | 12/1995 | Gilbert et al. | 717/160 |
| 5,737,623 A | * | 4/1998 | Liebrock | 712/13 |
| 2002/0174415 A1 | * | 11/2002 | Hines | 717/127 |
| 2003/0008684 A1 | * | 1/2003 | Ferris | 455/561 |
| 2003/0216901 A1 | * | 11/2003 | Schaumont et al. | 703/13 |
| 2004/0103263 A1 | * | 5/2004 | Colavin et al. | 712/15 |
| 2005/0143966 A1 | * | 6/2005 | McGaughy | 703/3 |
| 2005/0257278 A1 | * | 11/2005 | Lee et al. | 800/14 |

* cited by examiner

*Primary Examiner*—Thai Phan
(74) *Attorney, Agent, or Firm*—Lahive & Cockfield LLP

(57) ABSTRACT

An electronic device and method are provided to enable simulation of a system while minimizing a requirement to reanalyze or recompile topology information during subsequent simulations of the system. Instructions representative of compiling a topology of the system and at least one relationship among a plurality of parameters of the system may be obtained. The instructions, including reading a data structure containing the plurality of parameters to create an intermediate representation representative of the system and the plurality of parameters may be executed. In some implementations, time and effort required to perform system simulations can be reduced, even when parameters that represent the system are changed during each execution of the simulation.

26 Claims, 6 Drawing Sheets

RUNTIME PARAMETER MAPPING FOR SYSTEM SIMULATION

FIELD OF THE INVENTION

The present invention relates generally to systems simulation, and more particularly to the management of topology and parameter information representing the system being simulated.

BACKGROUND OF THE INVENTION

Parameterized graphs can be used to describe a large class of continuous dynamical systems, discontinuous discrete systems and hybrid systems. Many commercial and academic simulation tools use parameterized graphs to represent a variety of systems from transportation networks to finite state machines. Parameterized graphs contain two distinct but dependent pieces of information: topology and parameterization. Topology consists of a set of components and their connectivity, e.g., which components are connected to which and how. A set of parameters can parameterize each component in the topology. These parameters conform to a template or schema that defines the form the parameters should take, e.g., data-type, dimensions etc. The graph parameterization consists of the combined parameters for all components in a given topology.

Resistor-Inductor-Capacitor or RLC electrical circuits are simple examples of parameterized graphs. The topology of an RLC circuit consists of a number of interconnected resistors, capacitors and inductors. Each resistor, capacitor or inductor requires a single real number or parameter (e.g. resistance, capacitance or inductance) to describe how it behaves. The connectivity of the components and their parameters comprises a parameterized graph that represents the RLC circuit. For efficient simulation of continuous, discrete or hybrid systems, both topology and parameter information are typically analyzed by a compiler and reduced to salient information suitable for a simulation kernel. Compilation is typically performed for every variation of parameter.

In the context of the previous RLC example, suppose a simulation kernel simulates dynamical systems expressed in state-space form:

$$\begin{bmatrix} \dot{x} \\ y \end{bmatrix} = \begin{bmatrix} A & B \\ C & D \end{bmatrix} \begin{bmatrix} x \\ y \end{bmatrix}$$

where x is the continuous state, u is the input and y is the output. A, B, C and D are coefficient matrixes and are computed by the compiler based on the parameterized graph representing the RLC circuit. In more formal terms, the compiler is, in part, a map F:P→R sending a set of input parameters p ∈P to a set of runtime data, r ∈R. In some cases, such as block diagram modeling, this map is independent of the way in which components are connected and P may be mapped to R without consideration of the topology. However, in many dynamical, discrete and hybrid systems, F is highly dependent on topology. In the RLC example, the state-space form, A, B, C and D, cannot be computed directly from the resistances, capacitances and inductances of the individual components, rather A, B, C and D arise from both topological and parametric analysis. The dependency of F on the topology presents a unique problem for the simulation of dynamical, discrete or hybrid systems, namely how to resimulate a system with the same topology but a new set of parameters without a requirement to reanalyze the topology. Most existing compilation schemes require complete reanalysis, both topological and parametric, if either the topology or the parameterization of a parameterized graph changes.

SUMMARY OF THE INVENTION

The present invention is directed to the simulation of a system while minimizing a requirement to reanalyze or recompile topology information during subsequent simulations of the system. Embodiments of the invention can provide for multiple simulations of a system with many different parameterizations without revisiting a fixed topology for each simulation. In some implementations, this can substantially reduce the time and effort required to perform system simulations, even when parameters that represent the system are changed during each execution of the simulation.

According to an embodiment of the invention, a method for preparing a simulation of a system is provided. In the method, instructions representative of compiling a topology of the system and at least one relationship among a plurality of parameters of the system may be obtained. The instruction, including reading a data structure containing the plurality of parameters to create an intermediate representation representative of the system and the plurality of parameters may be executed.

According to another embodiment of the invention, a method for simulating a system is provided including the steps of reading a data structure editable by a user and having parameters corresponding to the system. An intermediate representation containing information regarding a topology of the system and at least one relationship among the parameters is updated, and a simulation of the system represented by the intermediate representation is executed.

An interpreter for use with data associated with a system is provided according to another embodiment of the invention. The interpreter is adapted to perform a method having the steps of reading a data structure containing the parameters corresponding to the system. Previously-obtained instructions representative of compiling a topology of the system and at least one relationship among the parameters into an intermediate representation representative of the system is executed.

According to an embodiment of the invention, a medium is provided holding electronic device executable steps for a method. The method includes the steps of obtaining instructions representative of compiling a topology of the system and at least one relationship among a plurality of parameters of the system. The instructions, including reading a data structure containing the plurality of parameters to create an intermediate representation representative of the system and the plurality of parameters is executed.

BRIEF DESCRIPTION OF THE DRAWINGS

The present invention will become better understood with reference to the following description and accompanying drawings, wherein.

DETAILED DESCRIPTION

Figure 1:
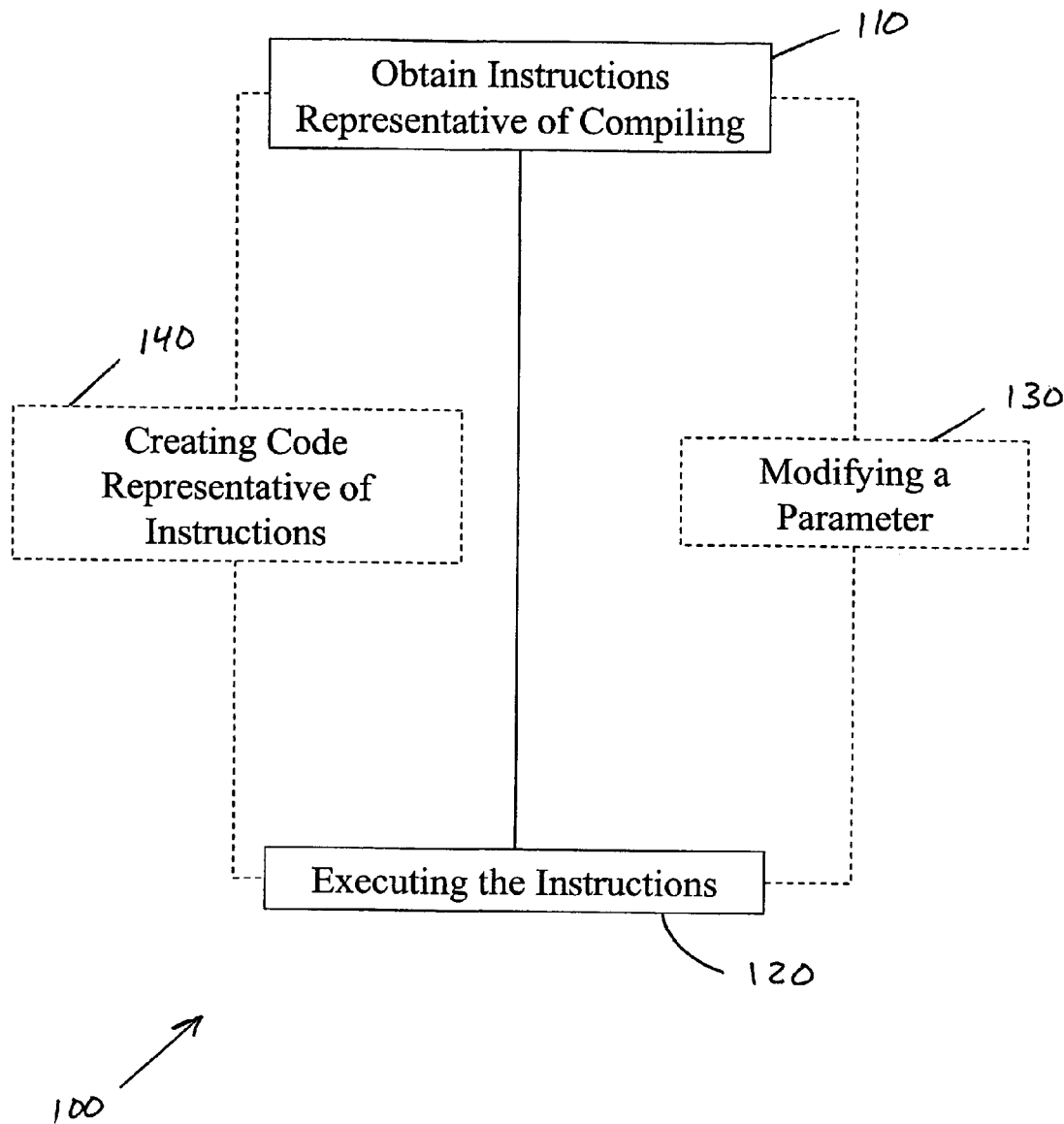
FIG. 1 illustrates a method according to an illustrative embodiment of the invention.

According to one embodiment of the invention, a runtime data context can serve as the mechanism that constructs the map, F:P→R. The runtime data context can implement three functionalities, including maintaining a data structure for storing and providing access to user data and runtime data, storing and providing an API for the construction of an intermediate representation (IR) and containing a virtual machine that interprets the IR.

Parameterization, runtime data and work data can together comprise the three components of data stored in the data structure. Parameter values can be placed into the runtime data context's data structure based on the schema for each topological component. Runtime data can be extracted from the runtime data context and passed to the simulation kernel at runtime. Clients of the runtime data context may use work data as intermediate data while manipulating parameters into runtime data. External interactions with the data structure can be performed with one level of indirection via handles or other references. As used herein by way of example, the notations $p_i$, $w_j$ and $r_k$ represent these handles of parameters, work data and runtime data, respectively.

Intermediate representation is a general term applied to the class of descriptive abstractions representative of computer programs or procedures. Intermediate representations typically embody the operations of a program or procedure, the data on which the program or procedure acts, and the data types to which the data is bound. Intermediate representations are commonly used while compiling a program, translating a program, interpreting a program, optimizing a program or any combination thereof. Example implementations of intermediate representations are triples, quadruples and control-flow graphs. Intermediate representations are typically stored and manipulated in the random access memory of a computer but can be saved to and read from binary or text files by a wide variety of electronic devices. Intermediate code, intermediate form and intermediate language are other examples of terms that may be used in the art to refer to intermediate representations.

The IR can be instructions, such as a sequence of steps, acting as a history of manipulations made on the parameterization. In an illustrative embodiment of the invention, the IR consists of an array of quadruples. Each quadruple can consist of four parts, op, arg1, arg2 and result. The operation, op, represents any one of a finite set of operations provided by the runtime data context. Matrix multiplication, addition, subtraction or assignment are examples of operations. arg1 and arg2 are inputs to the operation and result is the output. The following arithmetic:

$r_1 = p_1 p_2 + p_3$ $r_2 = r_1^T$ in quadruple form becomes as shown in Table 1.

TABLE 1

| idx | op | arg1 | arg2 | result |
|---|---|---|---|---|
| 0 | matmult | $p_1$ | $p_2$ | $w_1$ |
| 1 | matadd | $w_1$ | $p_3$ | $r_1$ |
| 2 | mattrans | $r_1$ | $r_2$ | |

According to an illustrative embodiment of the invention, the IR can provide for the use of intermediate data as temporary variables and/or the use of higher level operations such as matrix operations. The IR's selection of operations contains, but is not limited to, the scalar operations found in a typical instruction set. Also, not all operations require two inputs. In this implementation, the IR has no constructs for control of flow, such as if-then-else statements.

According to the illustrative embodiment, the virtual machine can execute the array of quadruples updating the runtime data in the data structure. In this implementation, the virtual machine need not contain an execution stack or registers. The runtime data context may be "programmed" once and run may times, each time with a new set of parameters. For dynamical, discrete or hybrid systems, each parameter for each component in the parameterized graph may have an entry in the runtime data context's parameter data structure. Likewise, each piece of data passed to the simulation kernel may have an entry in the runtime data context's runtime data. The compiler, as it analyzes the topology, adds instructions, such as quadruples, to the IR. Each quadruple can represent a step in the process of converting parameters into runtime data. As such, the type and order of these quadruples depends on the topology. Finally, the compiler executes the array of quadruples generating a set of runtime data from the simulation kernel.

The user may change the parameterized graph by changing a few component parameters without changing the topology. Instead of re-analyzing the topology, the compiler determines that the current topology matches the topology passed to the previous compilation. The compiler can copy the new set of parameters into the runtime data context, execute the array or quadruples and generate a new set of runtime data.

The invention includes a wide variety of approaches to compare the topologies for similarity. By way of example, graph isomorphism algorithms such as the nauty algorithm can be employed, but these algorithms may be as resource intensive as the original topological analysis. Checksum comparisons using a one-way hash such as MD5 or CRC are within the scope of the invention and much faster. However, these checksum comparisons do run the risk of collision, i.e., two different topologies result in the same checksum. In the case of MD5 the probability of collision is 1 in $2^{128}$.

Users often want to generate code for their dynamical, discrete or hybrid system models. The generated code represents a specific model and may be optimized for rapid execution. To be able to vary a simulation, generated code should be parameterizable. In other words, the user should have some ability to change the parameters of the model without regenerating code for the model. Optionally, the parameterization could be in a human-understandable form, perhaps similar to that used in the original model. For example, it may not be very useful if the user could only parameterize the code of the RLC simulation example with the matrixes A, B, C and D. Instead, in an implementation of the invention, the user could parameterize the generated code with the resistances, capacitances and inductances of the individual circuit components.

The runtime data context enables such parameterization of the generated code. Each operation provided by the runtime data context can have additional information to allow it to be translated into generated code. In various examples, this translation could be from the IR to a high-level language such as C, directly to platform specific machine language and/or to another intermediate representation such as GNU RTL. The translation can make the virtual machine concrete in the generated code. Instead of running the virtual machine to generate runtime data, the generated code can execute the same sequence of operations. By including the functionality required to map from the parameterization to the runtime data, the resulting generated code may be parameterized without a need for recompiling upon changes of the parameters. Optionally, the parameters stored in the data structure may be human-understandable parameters, enabling a user to directly modify the contents of the data structure to be reflected in the simulation.

As illustrated in FIG. 1, in one embodiment of the invention, a method 100 is provided for preparing a simulation of a system. According to method 100, instructions are obtained, step 110. The instructions are representative of compiling a topology of the system and at least one relationship among the plurality of parameters of the system. The instructions may be executed, step 120. Executing the instructions includes reading a data structure that contains the plurality of parameters. Execution of the instructions utilizes the intermediate representation that is representative of the system, and also therefore the plurality of parameters that, along with the topology, represent the system.

Optionally, the method 100 may also include the step of modifying at least one parameter, step 130. The modified parameters is contained in the data structure that is read during the execution of the instructions, step 120. By modifying the parameter, a modified parameter set is created. One of the other embodiments of the invention, the execution of the instructions, 120, may be performed without a need to recompile the topology. By executing the instructions, step 120, a new intermediate representation is created that is representative of the system as defined by the topology and the modified parameter set.

The method 100 may also include the optional step of creating code representative of the instructions, step 140. In such a configuration, the execution of the instructions, step 120, may involve executing the generated code of step 140. Optionally, the code created in step 140 may be in C language, but it is understood that the invention includes a wide variety of other alternative languages.

Optionally, the data structure may be in a native language format suitable for direct modification by the user. The intermediate representation may optionally be created in state-form, such as the A, B, C, D form used in the examples above.

The invention may be used to simulate a wide variety of multi-body physical systems, and other systems, such as electrical circuits or any system that may be defined by a parameterized graph.

Figure 2:
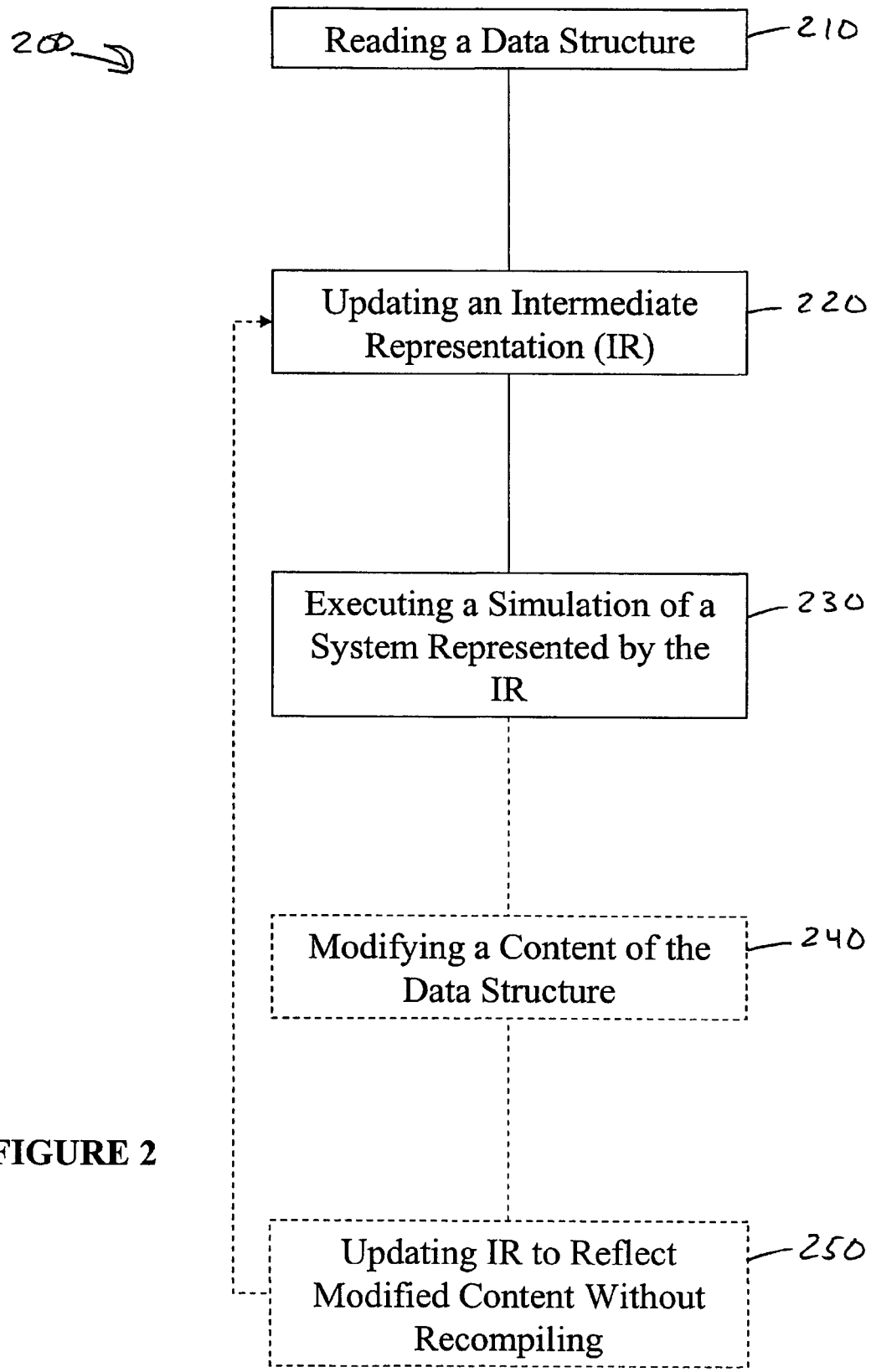
FIG. 2 illustrates another method according to another illustrative embodiment of the invention.

According to another embodiment of the invention, method 200, is provided for simulating a system. As illustrated in FIG. 2, a data structure that is editable by user is read, step 210. The data structure contains parameters corresponding to the system. An intermediate representation that contains information regarding the topology of the system and at least one relationship among the parameters, is updated, step 220, in view of the information read from the data structure, step 210. As simulation of the system is executed, step 230. The simulation is based on the system as represented by the updated intermediate representation.

According to an implementation of the invention, the updating step and executing step may be performed without compiling even through the content of the data structure may have been modified since the previous compiling.

Optionally, the method 200 for simulating a system may also include the step of modifying the contents of the data structure, step 240, to form an updated data structure. The intermediate representation is then updated, step 250, to form an updated intermediate representation to correspond to the topology and the updated data structure. According to this implementation of the invention, the execution of the simulation, step 230, may utilize the updated intermediate representation as representative of the system without a need to recompile.

Optionally, the method 200 for simulating a system may include modifying the content of the data structure, step 240, being performed by the user. Also, the intermediate representation may be in state-form. Optionally, the data structure may be in quadruple form.

Figure 3:
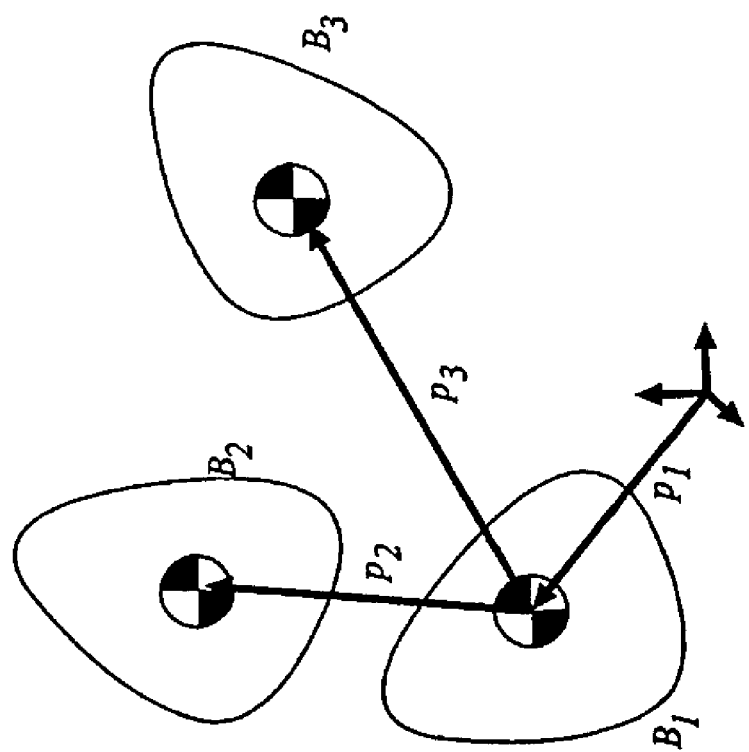
FIG. 3 illustrates an example system to be simulated having rigid bodies defined by relative positions.

A multi-body simulator, such as SimMechanics® from the MathWorks, Inc. of Natick, Mass., can include a simulation kernel. In an example of an illustrative embodiment of the invention, a multi-body simulator includes a simulation kernel that solves for the motions of rigid bodies in three-dimensional space, such as $R^3$, and a compiler that analyses user input and generates the salient data for the simulation kernel. Among other tasks, the compiler must determine the absolute positions of bodies in $R^3$ based on relative positions provided by the user. Consider the bodies depicted in the system 50 of FIG. 3. Vectors $p_1$, $p_2$ and $p_3 \in R^3$ position bodies $B_1$, $B_2$, and $B_3$ respectively. Note that each vector differs in its significance, $p_1$ locates $B_1$ with respect to the origin, $p_2$ locates $B_2$ with respect to $B_1$ and $p_3$ locates $B_3$ with respect to $B_1$. Therefore, the topology of this problem is:

$$B_1 \rightarrow O$$

$$B_2 \rightarrow B_1$$

$$B_3 \rightarrow B_1$$

where $\rightarrow$ represents dependence and O is the origin. This example defines the parameterization as the vectors $p_1$, $p_2$ and $p_3 \in R^3$ and the runtime data, the absolute positions of bodies $B_1$, $B_2$, and $B_3$, as $r_1$, $r_2$ and $r_3$. In this example, the compiler encodes the topology by first generating a text message representation of the topology: B1|O|B2|B1|B3|B1. This message represents each edge by a pair of | delimited strings. Then the compiler computes an MD5 checksum of the text message, bbfdae13e52b1069658a08c955e580bd, and stores the checksum for comparison to later topologies. For small topologies, this message generation and checksum computation may seem overly elaborate when compared to direct comparison but for larger topologies, more bodies and edges, the checksum method can be more efficient. The compiler, after further analysis of the topology, uses the following arithmetic to compute the absolute positions of the bodies:

$$r_1 = p_1$$

$$r_2 = r_1 + p_2$$

$$r_3 = r_1 + p_3$$

This arithmetic in quadruple form is:

TABLE 2

| idx | op | arg1 | arg2 | result |
|---|---|---|---|---|
| 0 | veccopy | $p_1$ | | $r_1$ |
| 1 | vecadd | $r_1$ | $p_2$ | $r_2$ |
| 2 | vecadd | $r_1$ | $p_3$ | $r_3$ |

After simulating once, the user may want rerun the simulation with the same topology but with a new set of relative positions, $p_1$, $p_2$ and $p_3$. The compiler reconstructs the text message, B1|O|B2|B1|B3|B1, recomputes the checksum, bbfdae13e52b1069658a08c955e580bd, and discovers that the topology has not changed since the last compilation. Therefore, the compiler stops its topological analysis and simply executes the script in Table 2, thus generating a new set of runtime data, $r_1$, $r_2$ and $r_3$, ready for simulation. If the user wished to generate code for this model, an automatic code generator could, by way of example, generate the following two files: position_computation.h and position_computation.c.

```
/*
 * File: position_computation.h
 */
#ifndef_position_computation_h_
#define_position_computation_h_
typedef struct position_parameterization_tag
{
real_T p1[3];
real_T p2[3];
real_T p3[3];
} position_parameterization;
typedef struct position_runtime_tag
}
real_T r1[3];
real_T r2[3];
real_T r3[3];
} position_runtime;
extern
void position_computation(const position_parameterization
    *p,
position_runtime *r);
#endif/*_position_computation_h_*/
/* [EOF] position_computation.h*/
/*
 * File: position_computation.c
 */
#include "position_computation.h"
void position_computation(const position_parameterization
    *p,
position_runtime *r)
{
/*
 * r1=p1
 */
r→r1[0]=p→p1[0];
r→r1[1]=p→p1[1];
r→r1[2]=p→p1[2];
/*
 * r2=r1+p2
 */
r→r2[0]=r→r1[0]+p→p2[0];
r→r2[1]=r→r1[1]+p→p2[1];
r→r2[2]=r→r1[2]+p→p2[2];
/*
 * r3=r1+p3
 */
r→r3[0]=r→r1[0]+p→p3[0];
r→r3[1]=r→r1[1]+p→p3[1];
r→r3[2]=r→r1[2]+p→p3[2];
}
/* [EOF] position_computation.c */
```

In this example, the type, real_T, represents a generic floating point number, either single or double precision. The data structure, position_parameterization, contains the user parameterization $p_1$, $p_2$ and $p_3$. The data structure, position_runtime, contains the runtime parameterization, $r_1$, $r_2$ and $r_3$. Finally, the function, position_computation, implements the conversion of user parameterization $p_1$, $p_2$ and $p_3$ to runtime parameterization, $r_1$, $r_2$ and $r_3$. It takes as input position_parameterization and provides position_runtime as output.

Figure 4:
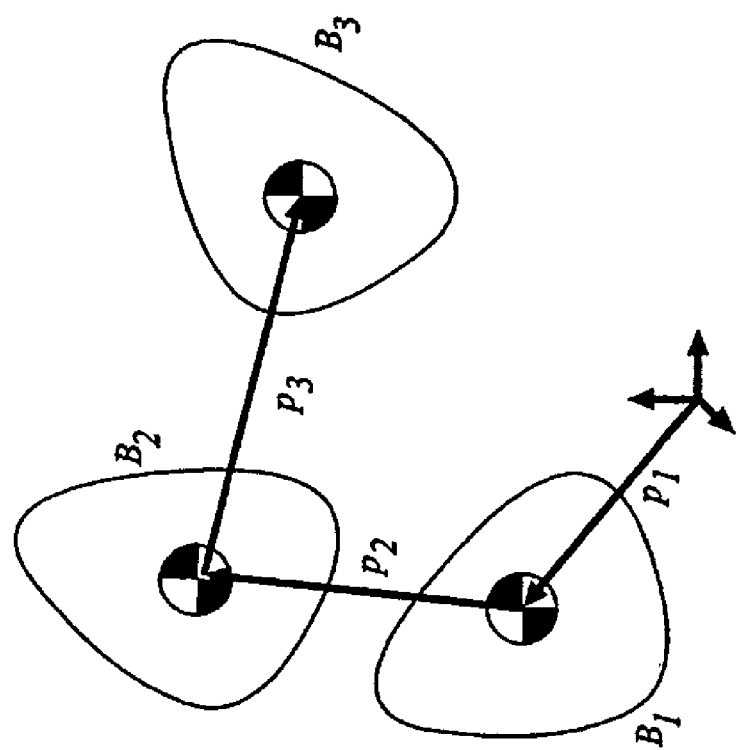
FIG. 4 illustrates another example system to be simulated having rigid bodies defined by relative positions.

The example of the illustrative embodiment of the invention is applied to a new topology, shown in the system 60 of FIG. 4. The bodies shown in FIG. 4 are the same as those in FIG. 3, except that the relative position of B3 is no longer with respect to B1, it is with respect to B2. Therefore, the new topology for this system is:

$$B_1 \rightarrow O$$

$$B_2 \rightarrow B_1$$

$$B_3 \rightarrow B_2$$

The compiler constructs a text message, B1|O|B2|B1|B3|B2, computes the checksum, 6963c7f16fac60765acca298200cc3ea, and discovers that the topology has changed. The compiler must revisit the topology and arrive at new arithmetic for the conversion of user data to runtime data:

$$r_1 = p_1$$

$$r_2 = r_1 + p_2$$

$$r_3 = r_2 + p_3$$

This arithmetic in quadruple form is:

TABLE 3

| idx | op | arg1 | arg2 | result |
|---|---|---|---|---|
| 0 | veccopy | $p_1$ | | $r_1$ |
| 1 | vecadd | $r_1$ | $p_2$ | $r_2$ |
| 2 | vecadd | $r_2$ | $p_3$ | $r_3$ |

If the user wished to generate code for this new topology the generated code would look like:

```
/*
 * File: position_computation.h
 */
#ifndef_position_computation_h_
#define_position_computation_h_
typedef struct position_parameterization_tag
{
real_T p1[3];
real_T p2[3];
real_T p3[3];
} position_parameterization;
typedef struct position_runtime_tag
}
real_T r1[3];
real_T r2[3];
real_T r3[3];
} position_runtime;
extern
void position_computation(const position_parameterization
    *p,
position_runtime *r);
#endif/*_position_computation_h_*/
/* [EOF] position_computation.h*/
/*
 * File: position_computation.c
```

```
*/
#include "position_computation.h"
void position_computation(const position_parameterization
       *p,
position_runtime *r)
{
/*
* r1=p1
*/
r→r1[0]=p→p1[0];
r→r1[1]=p→p1[1];
r→r1[2]=p→p1[2];
/*
* r2=r1+p2
*/
r→r2[0]=r→r1[0]+p→p2[0];
r→r2[1]=r→r1[1]+p→p2[1];
r→r2[2]=r→r1[2]+p→p2[2];
/*
* r3=r2+p3
*/
r→r3[0]=r→r2[0]+p→p3[0];
r→r3[1]=r→r2[1]+p→p3[1];
r→r3[2]=r→r2[2]+p→p3[2];
}
/* [EOF] position_computation.c*/
```

Consider the use of the above mentioned multi-body simulator in a larger model, such as a model for use in Simulink® from the MathWorks, Inc. of Natick, Mass. The bodies are represented as Simulink® blocks and the topology as lines connecting the blocks. When the user starts the model, Simulink® passes a graph representing the topology and a set of parameters for each block to the compiler which performs the analysis described above. The result of which parameterizes the simulation kernel that interacts with Simulink® during simulation via an S-Function.

Real-Time Workshop (RTW) from the MathWorks, Inc. of Natick, Mass. uses the compiled block diagram to generate code for the model via the Target Language Compiler (TLC), also from the MathWorks, Inc. of Natick, Mass. While generating code, RTW calls the S-Function mdlRTW function which in turn calls the specialized code generator for the multi-body solver.

RTW can handle the original parameterization for the multi-body blocks in the generated code. These parameters appear in the _Parameters data structure generated by RTW:
```
typedef struct_Parameters Parameters;
[ . . . ]
struct_Parameters {
[ . . . ]
real_T B1_p[3];/* B1 position */
[ . . . ]
real_T B2_p[3];/* B2 position */
[ . . . ]
real_T B3_p[3];/* B3 position */
[ . . . ]
};
[ . . . ]
extern Parameters rtP;
```

The [ . . . ] indicates that the parameters for each body block appear among the parameters for other blocks in the model. The instantiation of the Parameters data structure in rtP represents the original parameterization of the model. The automatically generated definition of rtP:
```
Parameters rtP={
[ . . . ]
{1.0, 2.0, 3.0},/* B1_r*/
[ . . . ]
{3.0, 2.0, 1.0},/* B2_r*/
[ . . . ]
{2.0, 3.0, 1.0},/* B3_r*/
[ . . . ]
};
``` can be edited to change the parameterization of the model.

According to an embodiment of the invention, code generated by TLC lifts the parameters from rtP, places them in position_parameterization, computes position_runtime and passes the result to the simulation kernel.
```
position_parameterization posP;
position_runtime posR;
memcpy(posR.p1, rtP.B1_p, sizeof(real_T) * 3);
memcpy(posR.p2, rtP.B2_p, sizeof(real_T) * 3);
memcpy(posR.p3, rtP.B3_p, sizeof(real_T) * 3);
position_computation(&posP, &posR);
```
The above code only needs to be executed once at the beginning of simulation.

Figure 5:
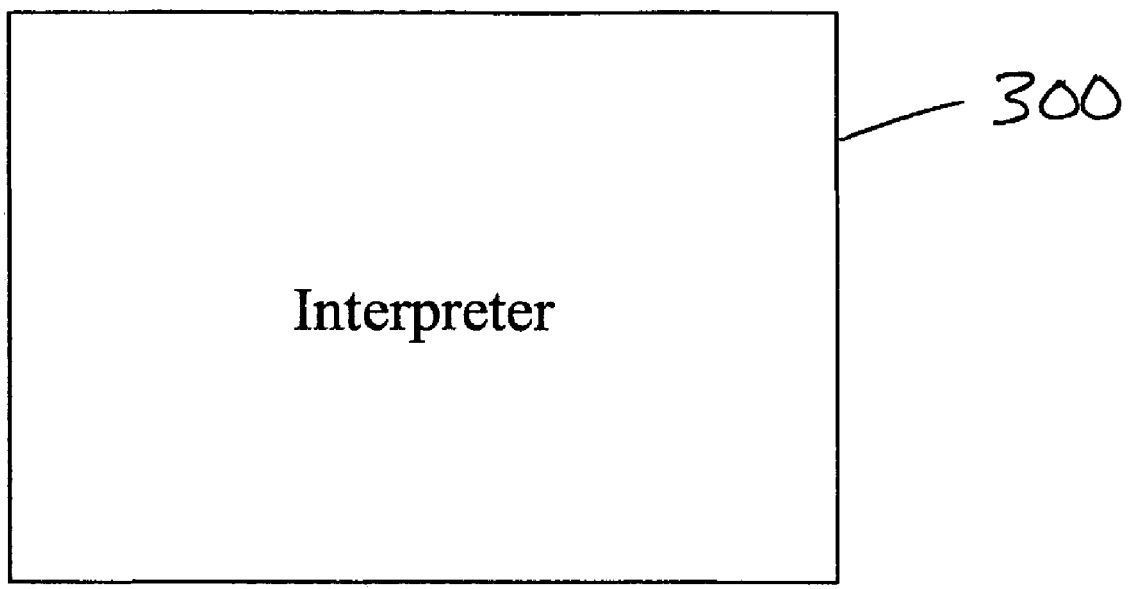
FIG. 5 illustrates an interpreter according to an embodiment of the invention.

According to a further embodiment of the invention, an interpreter 300 may be provided for use with data associated with the system. See FIG. 5. The interpreter 300 may be configured to read the data structure containing parameters corresponding to the system, and execute previously obtained, such as pre-recorded, instructions that represent compiling a topology of the system, and at least one relationship among the parameters corresponding to the system into an intermediate representation that is representative of the system.

Figure 6:
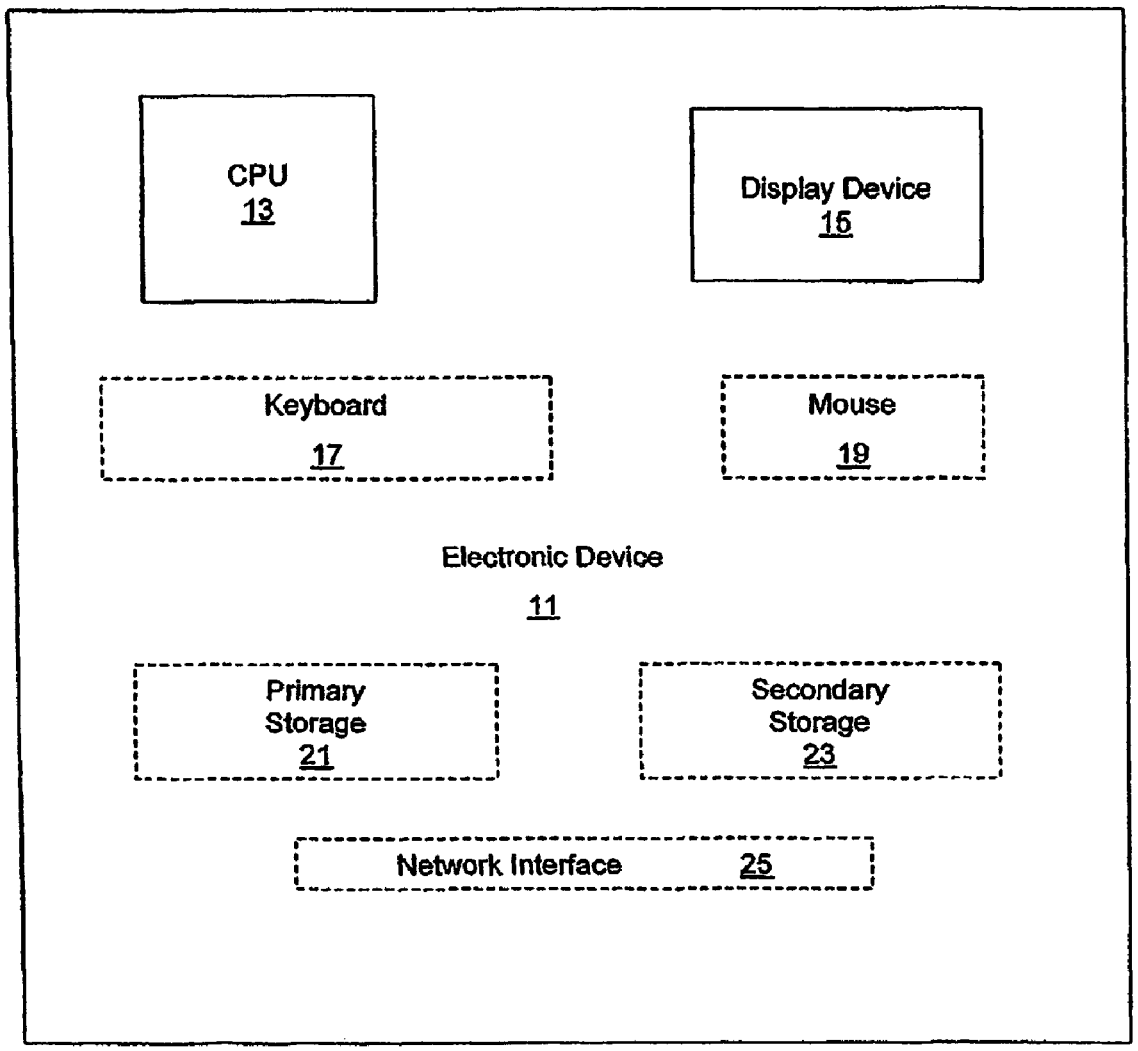
FIG. 6 is a diagrammatic illustration of an electronic device for implementing an aspect of the present invention.

FIG. 6 illustrates one example embodiment of an electronic device 11 suitable for practicing the illustrative embodiment of the present invention. The electronic device 11 is representative of a number of different technologies, such as mainframes, personal computers (PCs), laptop computers, workstations, personal digital assistants (PDAs), Internet appliances, cellular telephones, and the like. In the illustrated embodiment, the electronic device 11 includes a central processing unit (CPU) 13 and a display device 15. The display device 15 enables the electronic device 11 to communicate directly with a user through a visual display. The electronic device 11 may further include a keyboard 17 and a mouse 19. Other potential input devices not depicted include a stylus, trackball, joystick, touch pad, touch screen, and the like. The electronic device 11 may include primary storage 21 and/or secondary storage 23 for storing data and instructions. The storage devices 21 and 23 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 21 and 23. The electronic device 11 may also include a network interface 25 for communicating with one or more electronic devices external to the electronic device 11. A modem (not shown) is one form of establishing a connection with an external electronic device or network. The CPU 13 has either internally, or externally, attached thereto one or more of the aforementioned components.

Various embodiments of the invention may be used with dynamical, discrete and hybrid systems that are described in forms other than parameterized graphs. These descriptions could be, for example, bond graphs, or declarative languages such as those used by Modelica or VHDL-AMS. These forms may involve parameterized components acting together in a certain configuration. Also, many techniques for analyzing models represented in these forms will make use of a parameterized graph internally.

The IR and virtual machine used by the runtime data context could be far more sophisticated. A stack-based virtual machine along with a dispatching operation in the IR would allow the construction of functions that contain frequency used sequences of operations thus saving memory consumed by duplicated operation sequences. A register-based virtual machine could reduce the amount of work data required and could potentially eliminate the need for work data entirely.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the invention, and exclusive use of all modifications that come within the scope of the appended claims is reserved. It is intended that the present invention be limited only to the extent required by the appended claims and the applicable rules of law.

What is claimed is:

1. A method for preparing a simulation of a system, comprising:
    obtaining instructions representative of compiling a topology of said system and at least one relationship among a plurality of parameters of said system;
    maintaining at least one of said plurality of parameters in a data structure as a parameter set;
    modifying said at least one of the plurality of parameters to create a modified parameter set; and
    executing said instructions by reading said data structure containing said modified parameter set to create an intermediate representation representative of said system and said modified parameter set, the executing occurring absent recompiling said topology.

2. The method of claim 1, wherein before said executing step, a topology corresponding to the modified parameter set is determined to match the topology corresponding to said step of obtaining instructions representative of compiling a topology.

3. The method of claim 2, wherein a checksum is used to determine whether said topology corresponding to the modified parameter set matches the topology corresponding to said step of obtaining instructions representative of compiling a topology.

4. The method of claim 1, wherein said modifying step is performed by a user by directly editing said data structure.

5. The method of claim 1, further comprising the step of creating code representative of said instructions.

6. The method of claim 5, wherein said code is in C language.

7. The method of claim 5, wherein said executing step comprises executing said code.

8. The method of claim 1, wherein said intermediate representation created in said executing step is in state-space form.

9. The method of claim 1, wherein said system is a multi-body physical system.

10. The method of claim 1, wherein said instructions are a sequence of steps.

11. A method for simulating a system, comprising:
    obtaining a data structure, editable by a user, that comprises parameters corresponding to said system;
    converting at least a portion of said system into an intermediate representation for simulating said portion, wherein the intermediate representation comprises information corresponding to a topology of said system, the intermediate representation further comprising at least one relationship among parameters of said system;
    creating an updated data structure by modifying at least one parameter in said data structure that corresponds to said portion of said system;
    generating an updated intermediate representation based on said intermediate representation, the updated intermediate representation corresponding to said topology and said updated data structure; and
    executing said updated intermediate representation to simulate said system, the executing occurring absent recompiling said intermediate representation.

12. The method of claim 11, wherein said modifying step is performed by said user.

13. The method of claim 11, wherein before said executing step, a topology corresponding to said updated data structure is determined to match the topology corresponding to said data structure.

14. The method of claim 13, wherein said topology corresponding to said updated data structure is determined to match said topology corresponding to said data structure by the use of a checksum.

15. The method of claim 11, wherein said intermediate representation is in state-space form.

16. The method of claim 11, wherein said data structure is in quadruple form.

17. The method of claim 11, wherein said system is a multi-body physical system.

18. A medium comprising electronic device executable steps for a method, said method comprising the steps of:
    obtaining instructions representative of compiling a topology of said system and at least one relationship among a plurality of parameters of said system;
    maintaining at least one of said plurality of parameters in a data structure as a parameter set;
    modifying said at least one of the plurality of parameters in said data structure to create a modified parameter set; and
    reading said data structure containing said modified parameter set to create an intermediate representation representative of said system and said modified parameter set, the reading allowing executing said instructions absent recompiling said topology.

19. The medium of claim 18, wherein said system is a multi-body physical system.

20. The medium of claim 18, wherein before said executing step, a topology corresponding to the modified parameter set is determined to match the topology corresponding to said step of obtaining instructions representative of compiling a topology.

21. The medium of claim 20, wherein a checksum is used to determine said topology corresponding to the modified parameter set matches said topology corresponding to said step of obtaining instructions representative of compiling a topology.

22. A computing system comprising:
    a data structure containing modifiable parameters corresponding to a model of a system;
    an updatable intermediate representation corresponding to a topology of said model and at least one relationship among said modifiable parameters, the updatable intermediate representation updating when at least one modifiable parameter is modified in said data structure; and a simulator for simulating said model by executing said updatable intermediate representation without recompiling said updatable intermediate representation after a modifiable parameter is modified.

23. The system of claim 22, wherein said simulator determines that a topology corresponding to the modified parameter set matches said topology corresponding to said updatable intermediate representation.

24. The system of claim 23, wherein said simulator initiates a checksum to determine whether said topology corresponding to the modified parameters set matches said topology corresponding to said intermediate representation.

25. The system of claim 22, wherein said intermediate representation is in a state-space form.

26. The system of claim 22, wherein said model of a system is a model of a multi-body physical system.

* * * * *